(12) United States Patent
Reid et al.

(10) Patent No.: US 11,758,742 B2
(45) Date of Patent: Sep. 12, 2023

(54) INCREASED-TRANSPARENCY PHOTOVOLTAIC DEVICE

(71) Applicant: OXFORD PHOTOVOLTAICS LIMITED, Yarnton (GB)

(72) Inventors: Terence Alan Reid, Yarnton (GB); Henry James Snaith, Yarnton (GB)

(73) Assignee: OXFORD PHOTOVOLTAICS LIMITED, Yarnton (GB)

( * ) Notice: Subject to any disclaimer, the term of this patent is extended or adjusted under 35 U.S.C. 154(b) by 349 days.

(21) Appl. No.: 16/352,521

(22) Filed: Mar. 13, 2019

(65) Prior Publication Data
US 2019/0214592 A1 Jul. 11, 2019

Related U.S. Application Data

(62) Division of application No. 15/312,369, filed as application No. PCT/GB2015/051452 on May 18, 2015, now abandoned.

(30) Foreign Application Priority Data

May 20, 2014 (GB) ..................... 1408947

(51) Int. Cl.
*H10K 30/15* (2023.01)
*H10K 39/10* (2023.01)
(Continued)

(52) U.S. Cl.
CPC ........... *H10K 30/151* (2023.02); *H01G 9/204* (2013.01); *H01G 9/2027* (2013.01);
(Continued)

(58) Field of Classification Search
CPC ............. H01L 51/4226; H01L 51/0032; H01L 51/0011; H01L 51/4233; H01L 51/4253;
(Continued)

(56) References Cited

U.S. PATENT DOCUMENTS 4,202,914 A * 5/1980 Havas ................. H01L 21/0272
204/192.26
4,758,828 A  7/1988 Mitsumori
(Continued)

FOREIGN PATENT DOCUMENTS

CN     201628822 U    11/2010
CN     103490011 A     1/2014
(Continued)

OTHER PUBLICATIONS

Hui-Seon Kim "Lead Iodide Perovskite Sensitized All-Solid-State Submicron Thin Film Mesoscopic Solar Cell with Efficiency Exceeding 9%" Scientific Reports | 2 : 591 | DOI: 10.1038/srep00591 (Year: 2012).*
(Continued)

*Primary Examiner* — Michael Y Sun
(74) *Attorney, Agent, or Firm* — Harness, Dickey & Pierce, P.L.C.

(57) ABSTRACT

A photovoltaic device comprises plural layers separated into plural cells, each comprising a region of a photoactive layer and electrodes on opposite sides thereof. Each of the regions of the photoactive layer are formed comprising a first part that comprises photoactive material and a second part that is not photoactive and that has a greater transmittance of visible light than the light absorbing photoactive material, in pre-selected locations, or in a pre-selected distribution of locations, across the region of the photoactive layer. One of the first and second parts are located in plural separate areas within the other of the first and second parts. The transparency of the photovoltaic device is increased by the transmission of light through the second part that is not photoactive.

16 Claims, 10 Drawing Sheets

(51) Int. Cl.
| | |
|---|---|
| *H10K 71/16* | (2023.01) |
| *H10K 30/30* | (2023.01) |
| *H10K 30/80* | (2023.01) |
| *H10K 71/20* | (2023.01) |
| *H10K 85/00* | (2023.01) |
| *H01G 9/20* | (2006.01) |
| *H10K 30/00* | (2023.01) |
| *H01L 21/02* | (2006.01) |
| *H01L 21/283* | (2006.01) |
| *H01L 21/285* | (2006.01) |

(52) U.S. Cl.
CPC ......... *H01G 9/2031* (2013.01); *H10K 30/152* (2023.02); *H10K 30/30* (2023.02); *H10K 30/80* (2023.02); *H10K 39/10* (2023.02); *H10K 71/166* (2023.02); *H10K 71/20* (2023.02); *H10K 71/231* (2023.02); *H10K 85/00* (2023.02); *H01L 21/0226* (2013.01); *H01L 21/02205* (2013.01); *H01L 21/02282* (2013.01); *H01L 21/02518* (2013.01); *H01L 21/02623* (2013.01); *H01L 21/283* (2013.01); *H01L 21/28568* (2013.01); *H10K 30/00* (2023.02); *Y02E 10/549* (2013.01); *Y02P 70/50* (2015.11)

(58) Field of Classification Search
CPC . H01L 51/0014; H01L 51/0017; H01L 51/44; H01L 27/301; H01L 51/42; H01L 21/02205; H01L 21/0226; H01L 21/02282; H01L 21/02518; H01L 21/02623; H01L 21/283; H01L 21/28568; H01G 9/2027; H01G 9/2031; H01G 9/204; Y02P 70/50; Y02E 10/549; Y02E 10/542; H10K 30/151; H10K 30/152; H10K 30/30; H10K 30/80; H10K 39/10; H10K 71/166; H10K 71/20; H10K 71/231; H10K 85/00; H10K 30/00
See application file for complete search history.

(56) References Cited

U.S. PATENT DOCUMENTS

| 6,350,946 | B1* | 2/2002 | Miyake | ............... H01G 9/2031 136/252 |
|---|---|---|---|---|
| 2006/0045966 | A1 | 3/2006 | Suzuki et al. | |
| 2007/0159061 | A1 | 7/2007 | Krummacher et al. | |
| 2011/0241539 | A1 | 10/2011 | Yan et al. | |
| 2011/0290296 | A1* | 12/2011 | Daniel | ............... H01L 31/0516 257/E31.124 |
| 2012/0184087 | A1 | 7/2012 | Peeters | |
| 2012/0286295 | A1 | 11/2012 | Han | |
| 2013/0074908 | A1* | 3/2013 | Suzuki | ............... H01L 27/302 136/249 |
| 2013/0206210 | A1* | 8/2013 | Niinobe | ............... H01L 31/048 136/246 |
| 2015/0122314 | A1* | 5/2015 | Snaith | ............... H01L 51/4213 136/255 |

FOREIGN PATENT DOCUMENTS

| DE | 202009003904 U1 | 7/2009 | | |
|---|---|---|---|---|
| EP | 1684550 A1 | 7/2006 | | |
| GB | 2336553 A | 10/1999 | | |
| WO | WO-2011048352 A1 | 4/2011 | | |
| WO | WO-2013171517 A1 | 11/2013 | | |
| WO | WO-2013171518 A1 * | 11/2013 | ......... | H01L 51/0032 |
| WO | WO-2013171520 A1 | 11/2013 | | |
| WO | WO-2014202965 A1 | 12/2014 | | |
| WO | WO-2015140522 A1 | 9/2015 | | |

OTHER PUBLICATIONS

Ameri et al., "Fabrication, Optical Modeling, and Color Characterization of Semitransparent Bulk-Heterojunction Organic Solar Cells in an Inverted Structure" (2010) Advanced Functional Materials, vol. 20, pp. 1592-1598.
Kang et al., "Manufacturing method fortransparent electric windows using dye-sensitized TiO2 solar cells" (2003) Solar Energy Materials & Solar Cells, vol. 75, pp. 475-479.
Burschka et al., "Sequential deposition as a route to high-performance perovskite-sensitized solar cells" (2013) Nature, vol. 499, pp. 316-319.
Liu et al., "Efficient planar heterojunction perovskite solar cells by vapour deposition" (2013) Nature, vol. 501, pp. 395-398.
Ball et al., "Low-temperature processed meso-superstructured to thin-film perovskite solar cells" (2013) Energy Environ. Sci., vol. 6, pp. 1739-1743.
Eperon et al., "Morphological Control for High Performance, Solution-Processed Planar Heterojunction Perovskite Solar Cells" (2014) Advanced Functional Materials, vol. 24, pp. 151-157.
Eperon et al., "Neutral Color Semitransparent Microstructured Perovskite Solar Cells" (2014) ACS Nano, vol. 8, pp. 591-598.

* cited by examiner

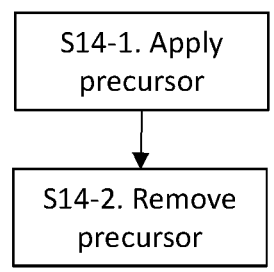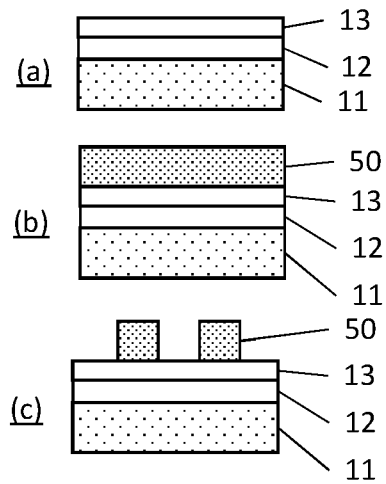
Figure 14
Figure 15
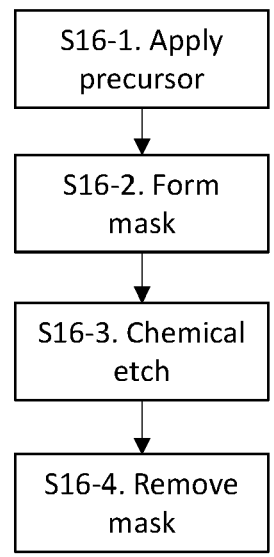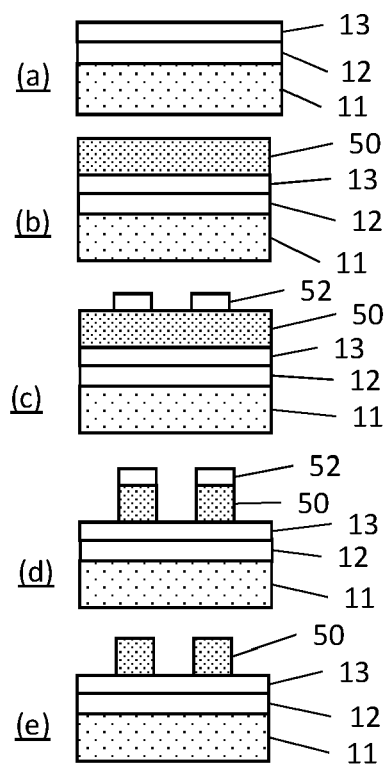
Figure 16
Figure 17

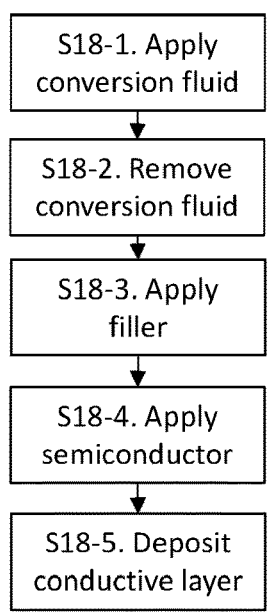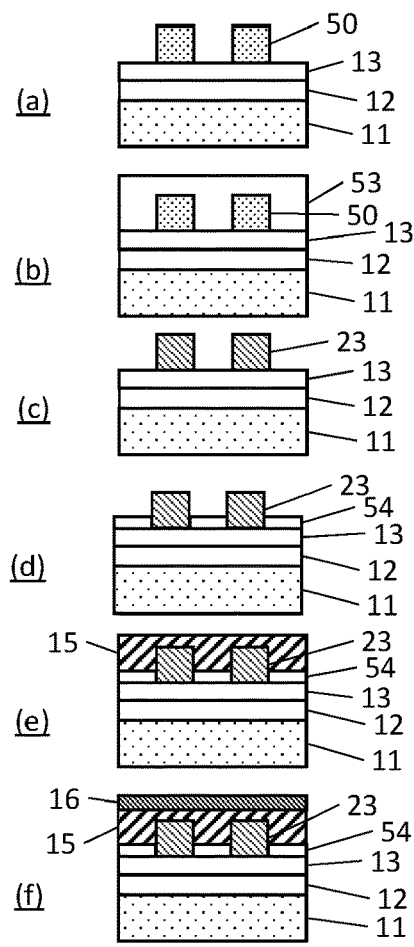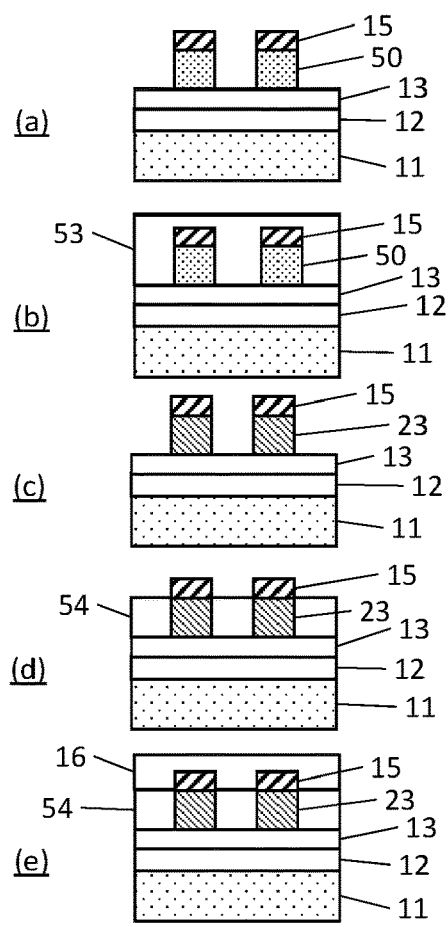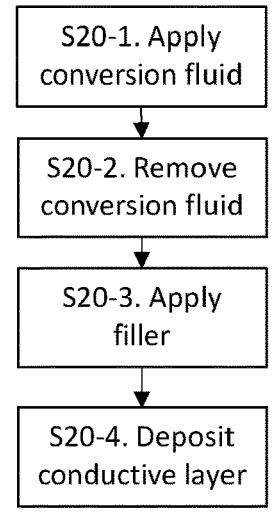

INCREASED-TRANSPARENCY PHOTOVOLTAIC DEVICE

CROSS-REFERENCE TO RELATED APPLICATIONS

This application is a divisional of U.S. patent application Ser. No. 15/312,369, filed on Nov. 18, 2016, which is a 371 U.S. National Stage of International Application No. PCT/GB2015/051452, filed on May 18, 2015, which claims the benefit of and priority to British Patent Application No. 1408947.8, filed on May 20, 2014. The entire disclosures of each of the above applications are incorporated herein by reference.

FIELD OF THE INVENTION

The present invention relates to a photovoltaic device that comprises plural layers including a light absorbing photoactive layer and conductive layers on opposite sides of the photoactive layer that may be separated into plural cells each comprising a region of the photoactive layer and conductive electrodes on opposite sides thereof. The present invention also relates to the manufacture of such a photovoltaic device.

BACKGROUND OF THE INVENTION

There is a requirement for such a photovoltaic device to have a relatively high degree of transparency. For example, it may be of interest to incorporate the photovoltaic device into a window pane, which opens up the possibility of BIPV (Building-integrated photovoltaics) in which the photovoltaic device is integrated into the windows of a building, as an alternative to the roof In many buildings, the area of the windows is greater than the area available on a roof. Furthermore, integration into the windows may allow energy generation to be achieved in manner that is more aesthetically pleasing than many existing types of photovoltaic devices that are typically slabs of dark material that appear unattractive. Clearly, a window pane into which a photovoltaic device is incorporated must remain sufficiently transparent to function as a window. To function as a photovoltaic device light is intrinsically absorbed, but some degree of absorption by a window is acceptable and is typically desirable to provide solar glazing effects and to control the energy budget of a building. In some instances, it may also be desirable to tint the glass.

Most recent approaches to achieve uniformly coated semi-transparency in solar cells have used organic solar cells or dye-sensitized cells (see, for instance, Kang, M. G., Park, N., Park, Y. J., Ryu, K. S. & H., C. S., Solar Energy Materials and Solar Cells 75, 475-479 (2003)). These technologies are solution-processable, representing a low-cost production method and easily scalable. However, their efficiencies are limited by large energy losses occurring at charge transfer interfaces. To attain colour-neutrality, the active materials must be chosen carefully, often at a loss to overall efficiency (Ameri, T. et al., Advanced Functional Materials 20, 1592-1598 (2010)).

An option with thin-film solar technologies is to simply reduce the thickness of the absorber to allow transparency. Indeed, this is precisely what is done with amorphous silicon, currently being installed in BIPV applications. However, due to the precise nature of the density of states in the conduction and valence bands, the absorption coefficient increasing from the band-gap with the result that thin films will take on a red or brown tint, which may not be the most desirable colour aesthetically.

Semiconducting perovskites have recently emerged as a new and interesting class of photovoltaic materials. They offer solution-processable bulk semiconductors which can be fabricated using inexpensive and abundant materials. High power conversion efficiencies of over 15% have now been demonstrated, for example in Burschka et al., "Sequential Deposition as a Route to High-Performance Perovskite-Sensitized Solar Cells", Nature 2013, 499, 316-319 and Liu et al., "Efficient Planar Heterojunction Perovskite Solar Cells by Vapour Deposition", Nature 2013, 501, 395-398.

It has also been shown that high-efficiency perovskite solar cells can be produced at low temperatures and in a fully planar thin-film architecture, reducing fabrication costs and simplifying the design, as described in Ball et al., "Low-Temperature Processed Mesosuperstructured to Thin-Film Perovskite Solar Cells", Energy Environ. Sci. 2013, 6, 1739-1743 and Eperon et al., "Morphological Control for High Performance, Solution Processed Planar Heterojunction Perovskite Solar Cells", Adv. Funct. Mater. 2013, 10.1002/adfm.201302090. These characteristics would make such perovskites ideal materials for fabrication of windows. However, thin films of such materials have a similar red or brown tint to thin films of amorphous silicon as mentioned above, which may not be the most desirable colour aesthetically.

In Eperon et al., "Neutral Color Semitransparent Microstructured Perovskite Solar Cells", ACS Nano 8 (2014), pp 591-598, there is disclosed a technique applied to the manufacture of a perovskite optoelectronic device to provide semi-transparency. In particular, the annealing process is controlled to provide intentional dewetting of the photoactive layer. This causes the photoactive material within the photoactive layer to separate into discontinuous areas or "islands" between which the photoactive material is removed. The part of the photoactive layer that comprises the photoactive material absorbs light and are therefore opaque. The remaining part of the photoactive layer has a significantly higher optically transmittance because the removal of the photoactive material means it is not photoactive. The combined effect is an increase of the overall transparency as perceived by an observer.

Such increased transparency may be achieved without adversely affecting the aesthetic properties of the photovoltaic device. If the part of the photoactive layer that comprises photoactive material absorbs light equally across the visible spectrum and the part that that is not photoactive is not itself coloured, then the photovoltaic device appears to be of neutral colour. This contrasts with the case of a thin film discussed above which is intrinsically coloured by the optical properties of the photoactive material. Conversely, a dye may be incorporated into the part that that is not photoactive to give the photovoltaic device any tint that is desired for aesthetic reasons.

These advantages are significant, but there is an issue that photovoltaic devices manufactured in this way exhibit scattering of light to some extent, resulting in them having an appearance of some degree of haziness to an observer. It would be desirable to achieve similar advantages whilst allowing better control of the optical properties of the photovoltaic device, for example reduction or control of the amount of light scattered.

SUMMARY OF THE PRESENT INVENTION

According to a first aspect of the present invention, there is provided a method of making a photovoltaic device comprising forming plural layers including a photoactive layer and conductive layers on opposite sides thereof, separated into plural cells each comprising a region of the photoactive layer and conductive electrodes on opposite sides thereof, the photoactive layer being formed by a process that causes each of the regions of the photoactive layer to comprise a first part that comprises light absorbing photoactive material and a second part that is not photoactive and that has a greater transmittance of visible light than the light absorbing photoactive material, which first and second parts are in pre-selected locations, or in a pre-selected distribution of locations, across the region of the photoactive layer with one of the first and second parts being located in plural separate areas within the other of the first and second parts.

According to a second aspect of the present invention, there is provided a photovoltaic photovoltaic device comprising plural layers including a photoactive layer and conductive layers on opposite sides thereof, separated into plural cells each comprising a region of the photoactive layer and conductive electrodes on opposite sides thereof, wherein each of the regions of the photoactive layer comprises a first part that comprises light absorbing photoactive material and a second part that is not photoactive and that has a greater transmittance of visible light than the light absorbing photoactive material, which first and second parts are in pre-selected locations, or in a pre-selected distribution of locations, across the region of the photoactive layer with one of the first and second parts being located in plural separate areas within the other of the first and second parts.

In accordance with the present invention, the photovoltaic device is manufactured with a region of the photoactive layer that comprises a first part that comprises light absorbing photoactive material and a second part that is not photoactive and that has a greater transmittance of visible light than the light absorbing photoactive material. Either one of the first and second parts is located in plural separate areas within the other of the first and second parts. Thus, as compared to a device in which the entire photoactive layer comprises photoactive material, an increase of the overall transparency as perceived by an observer is achieved in a similar manner to that achieved by the dewetting technique disclosed in Eperon et al., "Neutral Color Semitransparent Microstructured Perovskite Solar Cells", ACS Nano 8 (2014), pp 591-598, as discussed above. That is, whereas the first part of the region of the photoactive layer that comprises the photoactive material absorbs light, the second part of the region of the photoactive layer that is not photoactive has a significantly higher optically transmittance, thereby providing the increase of the overall transparency that is perceived. However, first and second parts are in pre-selected locations, or in a pre-selected distribution of locations, across the region of the photoactive layer.

This contrasts with the dewetting technique disclosed in Eperon et al., "Neutral Color Semitransparent Microstructured Perovskite Solar Cells", ACS Nano 8 (2014), pp 591-598. In such a dewetting technique, the separation of the photoactive material into discontinuous areas or "islands" occurs in random locations, because it arises from a surface energy effect in the material system as between the photoactive material and the layer on which it is formed. Thus, the locations of the part of the photoactive layer that comprises the photoactive material are not controlled and cannot be pre-selected, but instead have irregular locations in which the individual islands of photoactive material have random and convoluted shapes.

It has been appreciated that the apparent haziness resulting from a device manufactured using the dewetting technique results from the irregular pattern of locations in which the individual islands of photoactive material are formed. As these have random and convoluted shapes, although the overall size is large compared to wavelengths of visible light, the pattern contains many features which have a wavelength similar to that of visible light. Such features cause scattering of light to a degree that cannot be controlled.

In contrast, in accordance with the invention, the first and second parts are in pre-selected locations, or in a pre-selected distribution of locations, across the region of the photoactive layer. Such pre-selection of the locations, or distribution of locations, allows the optical properties of the photovoltaic device to be better controlled, because they may be selected to reduce or control the scattering of light. To reduce scattering the locations may be selected so that there are no features in the pattern of locations which have a wavelength similar to that of visible light. To provide a desired degree of scattering, other patterns of locations may be selected but in a controlled way.

The pre-selected locations, or in a pre-selected distribution of locations may be achieved by a range of techniques applied during the process of forming the photoactive layer during manufacture of the photovoltaic device. Many different examples are discussed in detail below, but these typically involve selective creation or selective removal of a component used to form the photoactive layer, for example selective creation using a printing, patterning or spraying technique or selective removal using an etching technique.

In one type of device, the first and second parts may be in pre-selected locations across the region of the photoactive layer with the locations of one of the first and second parts being plural separate areas of pre-selected position, shape and size. This may be achieved by manufacturing processes that allow complete control over the locations of the first and second parts.

In another type of device, the first and second parts may be in a pre-selected distribution of locations across the region of the photoactive layer with the locations of said one of the first and second parts being plural separate areas in a pre-selected distribution of position, shape and size. This may be achieved by manufacturing processes that do not allow complete control over the locations of the first and second parts, but nonetheless allow the distribution to be controlled. For example, this may be achieved by use of spraying processes to apply a substance. In that case, the pre-selected distribution of position, shape and size of said plural separate areas may be characteristic of the spraying process used.

Alternatively according to the first aspect of the present invention, there is provided a method of making an optoelectronic device comprising forming plural layers including a photoactive layer and conductive layers on opposite sides thereof, separated into plural cells each comprising a region of the photoactive layer and conductive electrodes on opposite sides thereof, the photoactive layer being formed by a process that causes each of the regions of the photoactive layer to comprise a first part that comprises photoactive material and a second part that is not photoactive, which first and second parts are in pre-selected locations, or in a pre-selected distribution of locations, across the region of photoactive layer with one of the first and second parts being located in plural separate areas within the other of the first and second parts. The various features discussed above with respect to the first and second aspects of the invention may equally be applied to this alternative.

Alternatively according to the second aspect of the present invention, there is provided an optoelectronic device comprising plural layers including a photoactive layer and conductive layers on opposite sides thereof, separated into plural cells each comprising a region of the photoactive layer and conductive electrodes on opposite sides thereof, wherein each of the regions of the photoactive layer comprises a first part that comprises photoactive material and a second part that is not photoactive, which first and second parts are in pre-selected locations, or in a pre-selected distribution of locations, across the region of the photoactive layer with one of the first and second parts being located in plural separate areas within the other of the first and second parts. The various features discussed above with respect to the first and second aspects of the invention may equally be applied to this alternative.

BRIEF DESCRIPTION OF THE DRAWINGS

Embodiments of the present invention will now be described by way of non-limitative example with reference to the accompanying drawings, in which:

FIGS. 10, 12, 14 and 16 are flow charts of alternative second stages of a method of making the photovoltaic device;

FIGS. 11, 13, 15 and 17 are schematic cross-sectional views of the photovoltaic device during the respective methods of FIGS. 10, 12, 14 and 16;

FIGS. 18, 20 and 22 are flow charts of alternative third stages of a method of making the photovoltaic device;

FIGS. 19, 21 and 23 are schematic cross-sectional views of the photovoltaic device during the respective methods of FIGS. 18, 20 and 22;

DETAILED DESCRIPTION

Definitions

Figure 1:
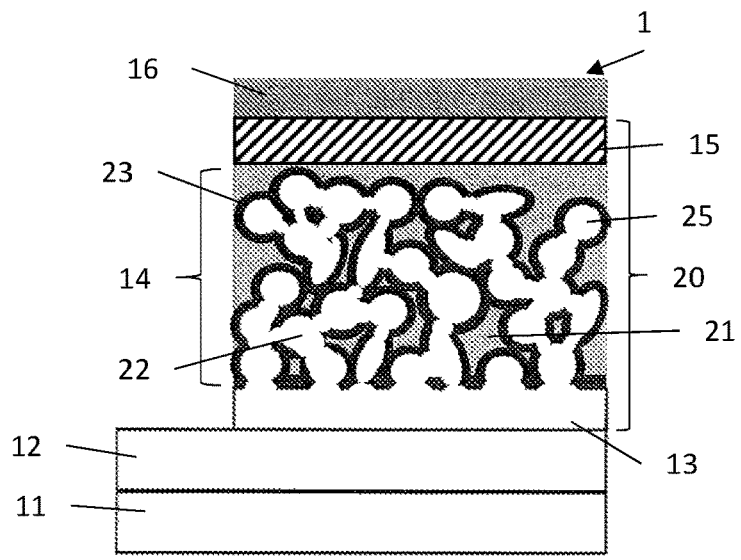
FIG. 1 is a schematic cross-sectional view of part of a photovoltaic device.

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "semi-transparent", as used herein, refers to material or object which has a transmission (alternatively and equivalently referred to as a transmittance) to visible light intermediate between a transparent material or object and an opaque material or object. Typically, a transparent material will have an average transmission for visible light (generally light with a wavelength of from 370 to 740 nm) of around 100%, or from 90 to 100%. Typically, an opaque material will have an average transmission for visible light of around 0%, or from 0 to 5%. A semi-transparent material or object will typically have an average transmission for visible light of from 10 to 90%, typically 40 to 60%. Unlike many translucent objects, semi-transparent objects do not typically distort or blur images. Transmission for light may be measured using routine methods, for instance by comparing the intensity of the incident light with the intensity of the transmitted light.

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (1/2, 1/2, 1/2) and the X anions are at (1/2, 1/2, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$ type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will often be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(1-cyclohexenyl)ethylammonium]$_2$PbBr$_4$. 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite material employed in the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e. a material which is capable of performing both photogeneration and charge transportation.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "organic cation" refers to a cation comprising carbon. The cation may comprise further elements, for example, the cation may comprise hydrogen, nitrogen or oxygen. The term "inorganic cation" refers to a cation that is not an organic cation. By default, the term "inorganic cation" refers to a cation that does not contain carbon.

The term "semiconductor", as used herein, refers to a material with electrical conductivity intermediate in magnitude between that of a conductor and a dielectric. A semiconductor may be an n-type semiconductor, a p-type semiconductor or an intrinsic semiconductor. The term "dielectric", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV (The band gap of titania is about 3.2 eV.)

Device Structure

A photovoltaic device 1 is shown in FIG. 1. The overall construction and function is as follows and is shared with all the subsequent embodiments.

The photovoltaic device 1 has a layered construction, in particular comprising a plurality of layers 11 to 16 described in detail below. Each of those layers is optically transmissive, that is transmits light. In each of the layers 11 to 16, such transmission of light may occur to any degree, and may be accompanied by some degree of absorption. Thus, overall the photovoltaic device 1 may be partially or completely transparent.

In FIG. 1 and the various other drawings showing cross-sectional views of a photovoltaic device 1, for the sake of clarity, the relative thickness of the various layers 11 to 16 is not drawn to scale. The layers may in fact have thicknesses that are typical for devices employing the type of photoactive layer 14 described below.

The photovoltaic device 1 comprises a base layer 11 which acts as a support for the other layers. The base layer 11 may be made of any suitable material, for example glass.

A bottom conductive layer 12 is deposited on the base layer 11. The bottom conductive layer 12 may be made of any suitable conductive material, for example a conductive oxide such as doped tin dioxide (SnO$_2$), a metal, or a conducting polymer. In one example, the bottom conductive layer 12 may be made of fluorine-doped tin oxide (FTO), SnO$_2$:F. The bottom conductive layer 12 may typically have a thickness in the range 50-500 nm or of that order.

With regards the bottom conductive layer 12, and also the bottom semiconductor layer 13, top semiconductor layer 15 and top conductive layer 16 described below, the words "bottom" and "top" refer to the photovoltaic device 1 in the orientation shown in the drawings, and corresponds to the order in which these layers are deposited during manufacture, the bottom conductive layer 12 and bottom semiconductor layer 13 being deposited before the top semiconductor layer 15 and top conductive layer 16. Of course, in use the photovoltaic device 1 may be arranged in any orientation.

A photoactive section 20 comprising three layers 13 to 15 is formed on the bottom conductive layer 12. The photoactive section 20 converts light into electrical current.

The photoactive section 20 comprises a bottom semiconductor layer 13 formed on the bottom conductive layer 12. The bottom semiconductor layer 13 is a layer of semiconductor material, which is generally non-porous, although this is not essential. Historically, this layer has sometimes been referred to as a "compact" layer. In this example, the bottom semiconductor layer 13 comprises n-type material, for example titanium dioxide, and acts as a hole blocking layer. The bottom semiconductor layer 13 may typically be of thickness of around 10 nm to 100 nm, or of that order.

The bottom semiconductor layer 13 may comprise a continuous phase of material, or may comprise assembled particles that may be fused together.

The term "n-type material" as used herein refers to an electron-transporting semiconductor material. Any suitable electron-transporting material may be employed. Typically, the n-type material may comprise a metal oxide, for example titanium dioxide (TiO$_2$), Zinc Oxide (ZnO), or tin dioxide (SnO$_2$).

A photoactive layer 14 is formed on the bottom semiconductor layer 13. The photoactive layer 14 comprises light absorbing photoactive material 23. The photoactive layer 14 may typically have a thickness in the range 0.5-2 μm or of that order.

The photoactive material 23 may comprise a photoactive perovskite. Such a perovskite is capable of absorbing electromagnetic radiation, and thereby generating free charge carriers. Suitable perovskites include organometal perovskites, and particularly organometal halide perovskites, such as those described in WO-2013/171517, WO-2013/171518 and WO-2013/171520.

As described above, a perovskite is a material with a three-dimensional crystal structure represented by formula (I):

$$[A][B][X]_3 \qquad (I)$$

wherein [A] is at least one cation, [B] is at least one cation, and [X] is at least one anion.

In a photoactive perovskite [A] may be at least one organic cation, at least one inorganic cation, or a combination/mixture of at least one organic cation and at least one inorganic cation. In particular, [A] can comprise at least one organic cation selected from methyl ammonium (CH$_3$NH$_3^+$), formamidinium (HC(NH$_2$)$_2^+$), and ethyl ammonium (CH$_3$CH$_2$NH$_3^+$). In addition, or alternatively, [A] may comprise at least one inorganic cation selected from Cs$^+$, Rb$^+$, Cu$^+$, Pd$^+$, Pt$^-$, Ag$^+$, Au$^+$, Rh$^+$, and Ru$^+$.

In a photoactive perovskite [B] may comprise at least one inorganic cation selected from Pb$^{2+}$ and Sn$^{2+}$, and is preferably Pb$^{2+}$.

In a photoactive perovskite [X] may be at least one halide anion, is preferably at least one halide anion selected from chloride (Cl$^-$), bromide (Br$^-$), and iodide (I$^-$), and is more preferably at least two halides selected from chloride (Cl$^-$), bromide (Br$^-$), and iodide (I$^-$).

Alternatively, photoactive material 23 may comprise a semiconductor other than a perovskite, such as: a copper zinc tin sulphide such as Cu$_2$ZnSnS$_4$ (CZTS); a copper zinc tin sulphur-selenide such as Cu$_2$ZnSn(S$_{1-x}$Se$_x$)$_4$ (CZTSSe); a copper indium gallium selenide such as CuIn$_{1-x}$Ga$_x$Se$_2$ (CIGS); an antimony or bismuth chalcogenide, such as, for example, Sb$_2$S$_3$, Sb$_2$Se$_3$, Bi$_2$S$_3$ or Bi$_2$Se$_3$; a dye-sensitised metal oxide such as dye-sensitised TiO$_2$; or an organic photosensitizing dye, such as for instance an indolene dye.

The photoactive layer 14 may comprise a layer of porous material 25 having pores 21 formed therein. The layer of porous material 25 has the purpose of acting as a structural support that supports the photoactive material 23. The layer of porous material 25 provides open structure having a relatively large surface area. When the porous material 25 has the purpose of carrying electrons or holes, it is continuous so as to provide electrical paths through the photoactive layer 14 to the bottom semiconductor layer 13.

The layer of porous material 25 may take various forms made by different techniques. In one form, the layer of porous material 25 may comprise assembled particles 22. In that case, during manufacture the layer of porous material 25 may be formed from separate particles that are assembled by being brought together and fused into the layer of porous material 25. However, other forms for the layer of porous material 25 that provide the porous, open structure including pores 21 are known and may be applied. Some examples of other forms for the layer of porous material 25 may not comprise assembled particles 22.

The layer of porous material 25 may be formed of any suitable material that can provide the open physical structure, as well as appropriate electrical properties.

If electron or hole transport needs to be provided, the porous material may be semiconductor material, for example titanium dioxide. The porous material 25 may be the same as the material of the bottom semiconductor layer 13, although different materials could in principle be used.

If the photoactive material 23 is sufficiently conductive, as is typically the case when the photoactive material 23 is a photoactive perovskite (as discussed further below), the porous material 25 may be electrically insulating, or in some instances may be omitted altogether.

The photoactive material 23 may fill the pores 21 of the photoactive layer 14. For example, this is typically the case when the photoactive material 23 is a photoactive perovskite.

As an alternative (not shown), the photoactive material 23 may be deposited on the surfaces of the pores 21. For example, this is typically the case when the photoactive material 23 is a dye-sensitised metal oxide or an organic photosensitizing dye. When the photoactive material 23 is deposited on the surfaces of the pores, then the pores 21 of the photoactive layer 14 may contain semiconductor material 26 which is of the opposite type to the bottom semiconductor layer, being p-type material in this example.

A top semiconductor layer 15 is formed on the photoactive layer 14. The top semiconductor layer 15 is a non-porous layer of semiconductor material. In this example, the top semiconductor layer 15 comprises p-type material. The top semiconductor layer 15 may comprise a continuous phase of material.

The term "p-type material" as used herein refers to a hole-transporting semiconductor material. Suitable p-type materials may be selected from organic or inorganic materials such as polymeric or molecular hole transporters or semiconducting metal oxides or halides. The p-type material may for instance comprise spiro-OMeTAD (2,2',7,7'-tetrakis-(N,N-di-p-methoxyphenylamine)9,9'-spirobifluorene)). The p-type material may for instance comprise CuSCN.

When semiconductor material is contained in the pores 21 of the photoactive layer 14, then the material of the top semiconductor layer 15 may be the same semiconductor material. In practical constructions, the two materials may typically be continuous and formed together during manufacture, although different materials could in principle be used.

Therefore, in the photoactive section 20 as a whole, the photoactive material 23 is disposed between: an n-type region of n-type material formed by the bottom semiconductor layer 13 (and in some constructions the layer of porous material 25); and a p-type region of p-type material formed by the top semiconductor layer 15 (and in some constructions the semiconductor material contained in the pores 21 of the photoactive layer 14).

A top conductive layer 16 is formed on the photoactive section 20. The top conductive layer 16 may be made of any suitable conductive material, for example a conductive oxide such as doped tin dioxide (SnO$_2$), a metal, or a conducting polymer. In one example, the top conductive layer 16 may comprise silver or carbon.

Where the top conductive layer 16 is made of a material having an insufficient conductivity, the photovoltaic device 1 may optionally further comprise conductive grids (not shown) having a higher conductivity than the top conductive layer 16.

Optionally, the photovoltaic device 1 may further comprise a protective layer (not shown) formed on top of the remainder of the photovoltaic device 1 for protection. The protective layer may be formed of any suitable material for example glass or a polymer. Although FIG. 1 illustrates an photovoltaic device 1 of a particular type, more generally the photovoltaic device 1 could be of any type, employing any type of photoactive material in a suitable construction that may include other materials appropriate to the utilize the photoactive material.

In the drawings, the interfaces between the various layers 11 to 16 are shown as being planar, but this is merely for clarity and in fact the interfaces between the various layers 11 to 16 may be uneven, depending on the materials used and the method of forming the layer.

The photovoltaic device 1 may in general have any shape and extent, although a rectangular shape is convenient for many applications. For example where the photovoltaic device 1 is intended to be applied as a window pane, the base layer 11 may be glass and have dimensions conventional for a window pane.

The photovoltaic device 1 could in principle have the construction shown in FIG. 1 across its entire area and that is within the scope of this disclosure. In that case, the photoactive layer 14 has a single region for which the entire bottom conductive layer 12 and top conductive layer 16 on opposite sides thereof form conductive electrodes.

In the hereinafter described arrangements, the layers 12 to 16, including the photoactive layer 14 and conductive layers 12 and 16, are separated into plural cells each comprising a region of the photoactive layer 14 and conductive electrodes on opposite sides thereof formed by the separated parts of the conductive layers 12 and 16.

Figure 2:
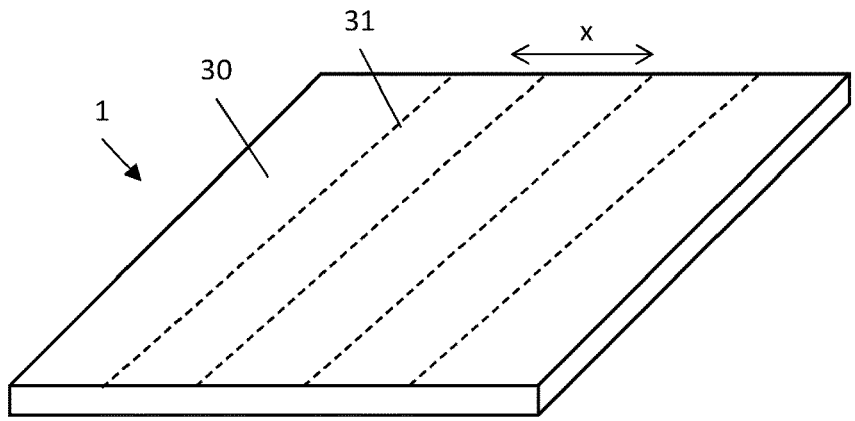
FIG. 2 is a perspective view of the photovoltaic device in a configuration with plural cells.

For example as shown in FIG. 2, the photovoltaic device 1 may be divided into a string of photoactive cells 30 distributed in a lateral direction X across the photovoltaic device 1. Five photoactive cells 30 are shown in FIG. 2 but in general there may be any number of photoactive cells 30. The photoactive cells 30 are formed by separating the layers 12 to 16 along the locations 31 shown by dotted lines 32.

Figure 3:
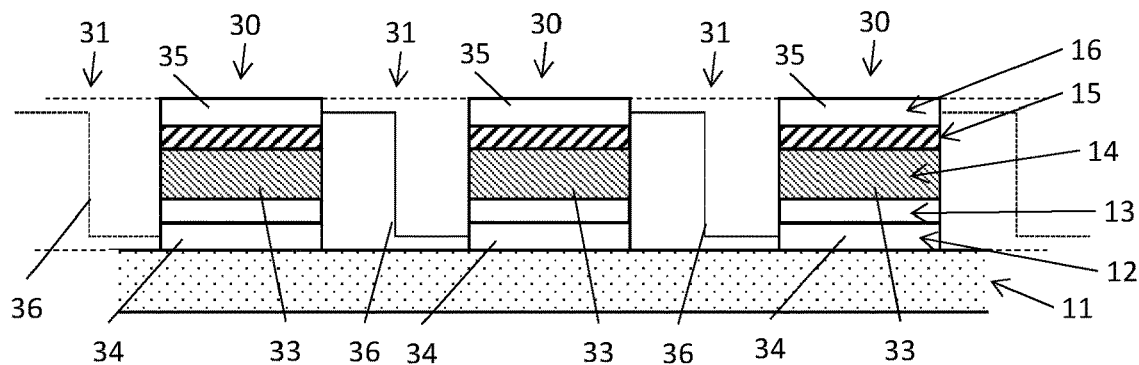
FIG. 3 is a cross-sectional side view of the photovoltaic device of FIG. 2 schematically illustrating electrical connectors between photoactive regions of the cells.

FIG. 3 schematically illustrates the separation of the layers of the photovoltaic device 1 to form the cells 30 and the electrical connections therebetween. As shown in FIG. 3, in locations 31 each of the layers 12 to 15 of the photoactive section 20 is separated. Thus, the photoactive layer 14 is separated into photoactive regions 33 that are electrically isolated from each other. In this context, "electrically isolated" means that electrical isolation is sufficient to allow the photoactive regions 33 to operate independently. Similarly, in locations 31 the bottom conductive layer 12 is separated into first electrodes 34 that are in electrical contact with respective photoactive regions 33, but are electrically isolated from each other. Likewise, the top conductive layer 16 is separated into second electrodes 35 that are in electrical contact with respective photoactive regions 33, but are electrically isolated from each other. Each photoactive region 33 is therefore electrically connected to a first electrode 34 and second electrode 35 on opposite sides of the region 33, each region 33 and the corresponding first electrode 34 and second electrode 35 together forming one of the photoactive cells 30.

In each location 31, there is further formed a respective electrical connector 36 extending from the second electrode 35 in electrical contact with one photoactive region 33 (on the left side of the electrical connector 36 in FIG. 3) to a first electrode 34 in electrical contact with an adjacent photoactive region (on the right side of the electrical connector 36 in FIG. 3). In this manner, the electrical connectors 36 provide connection of the photoactive regions 33 of the photoactive cells 30 in series laterally across the photovoltaic device 1. This series connection allows operation of the photovoltaic device 1 with an overall potential difference across the entire string of photoactive cells 30 that is the sum of the potential difference across the individual photoactive regions 33 of the photoactive cells 30. Thus, for a given type and configuration of the photoactive section 20, the number of photoactive cells 30 may be chosen to provide the required overall potential difference.

The electrical connectors 36 may take any form suitable to provide the interconnection. In one example, the electrical connectors 36 are formed by a portions formed integrally with the top conductive layer 16 extending down to the bottom conductive layer 12. In another example, the electrical connectors 36 may take the form disclosed in WO-2011/048352.

During manufacture, the photoactive layer 14 is formed by a process that causes it to comprise a first part 40 that comprises photoactive material and a second part 41 that is not photoactive, examples of which are shown in FIGS. 4 to 7. The first part 40 that comprises photoactive material absorbs light and has zero or low optical transparency, whereas the second part 41 that is not photoactive has a significantly higher optically transmittance to provide an overall transmittance perceived by an observer that is higher than that of the first part 40.

In the case that the photovoltaic device 1 has the construction shown in FIG. 1 across its entire area, then the entire region of the photoactive layer 14 has such a first part 40 and second part 41.

In the case that the photovoltaic device 1 is separated into plural cells 30, then each photoactive region 33 comprises such a first part 40 and second part 41.

Figure 4:
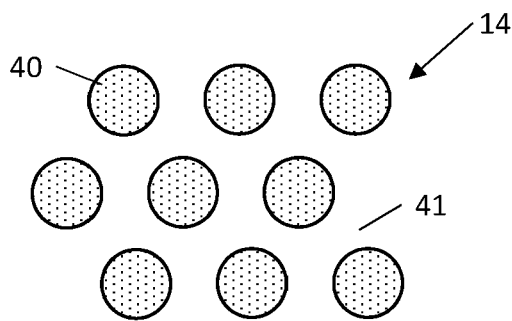
FIGS. 4 to 7 are a plan view of first and second parts of a region of a photoactive layer of the photovoltaic device.
Figure 5:
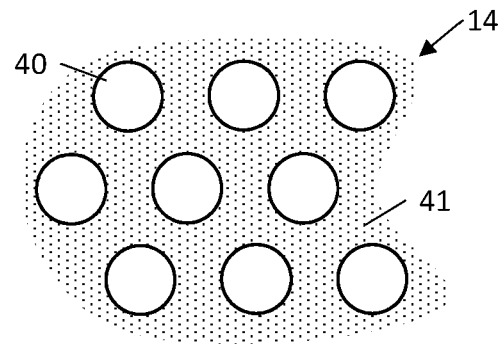
Figure 6:
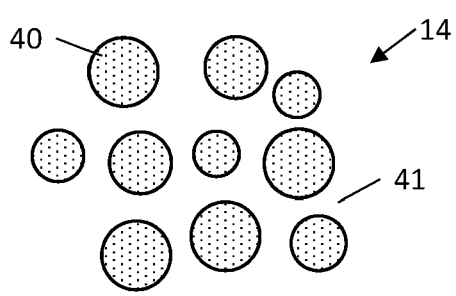
Figure 7:
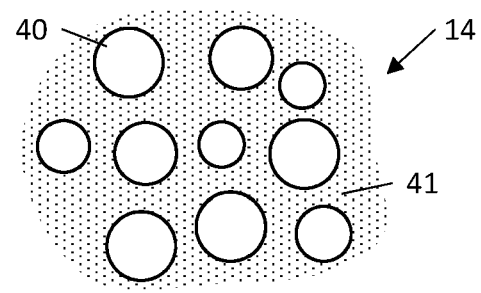

One of the first part 40 and second part 41 is located in plural separate areas within the other of the first part 40 and second part 41. This means that in the case that the photovoltaic device 1 is separated into plural cells 30, then each of cells 30 has plural separate areas which are smaller than the cells 30. By way of illustration, FIGS. 4 and 6 illustrate examples in which the first part 40 is located in plural separate areas within the second part 41, whereas FIGS. 5 and 7 illustrate examples in which the second part 41 is located in plural separate areas within the first part 40. In the limit of the plural separate areas just touching, they would form a checkerboard pattern or the like. A pattern in which the first part 40 is located in plural separate areas within the second part 41 may provide advantage to the electrical properties by isolating the areas of photoactive material from each other.

In contrast to a dewetting process in which the locations of photoactive and inactive parts is uncontrolled and not selected, the locations, or distribution of locations, of the first part 40 and second part 41 are pre-selected during the manufacture of the photoactive layer.

In one type of device, the first part 40 and second part 41 may be in pre-selected locations. This may be achieved by manufacturing processes that allow complete control over the locations of the first part 40 and second part 41. By way of illustration, FIGS. 4 and 5 illustrate examples in which the first part 40 and second part 41 are in pre-selected locations in which one of the first part 40 and second part 41 is located in plural separate areas that are circular and arranged in a regular pattern, although as an alternative the pattern could be irregular, even though pre-selected.

In another type of device, the first part 40 and second part 41 may be in a pre-selected distribution of locations. This may be achieved by manufacturing processes that allow do not allow complete control over the locations, but nonetheless allow the distribution to be controlled. For example, this may be achieved by use of spraying processes to apply a substance. In that case, the pre-selected distribution of position, shape and size of the plural separate areas may be characteristic of the spraying process used. By way of illustration, FIGS. 6 and 7 illustrate examples in which, respectively, the first part 40 and second part 41 are in a pre-selected distribution of locations that is characteristic of a spraying process.

The locations, or distribution of locations, are pre-selected to provide the photovoltaic device with desired optical properties.

The pattern of locations of the first part 40 and the second part 41 is chosen to minimize the visibility of the plural separate areas to an observer at a typical viewing distance that will depend on the application, so that the observer perceives an intermediate transmittance. This means that the first part 40 and the second part 41 may have a pattern of locations of smaller dimensions than can resolved by the observer. The ratio of the areas of the first part 40 and the second part 41 across regions of the photovoltaic device 1 that can be resolved by the observer may be chosen to be uniform or to vary in an aesthetically pleasing manner across the photovoltaic device 1. In the case that the photovoltaic device 1 is separated into plural cells 30, then each cell 30 may have a pattern of locations that are pre-selected in this way. For example, the pattern and/or the ratio of the areas of first part 40 and the second part 41 the cells 30 may be the same in each cell 30.

The locations, or distribution of locations, may be pre-selected to reduce scattering of light transmitted through the second part 41, or alternatively to control that scattering to a predetermined degree.

The areas of the one of the first part 40 and second part 41 located in plural separate areas may be provided with a characteristic size, such as an average diameter, that is larger than the maximum wavelength of visible light, which may be taken to be 780 nm. Similarly the average size of the gaps between those areas may be larger than the maximum wavelength of visible light, which may be taken to be 780 nm. Such patterns minimize scattering of light.

The areas of the one of the first part 40 and second part 41 located in plural separate areas may have a shape that does not provide features that interact with light having a characteristic size less than the maximum wavelength of visible light, which may be taken to be 780 nm. For example the shape may be circular. Such shapes minimize scattering of light.

For example, the pre-selected locations, including the sizes shapes and locations of the areas, can be chosen to minimize the total length of the interface between the first and second parts per unit area of the device and to prevent diffraction interference effects caused by repeating patterns, whilst maintaining a characteristic feature size that is greater than the wavelength of light but invisible to the eye when viewed from further than 1 m. Typically the feature size of the pattern of locations lies in the range from 1 μm to 1 mm.

Method of Making a Photovoltaic Device

There will now be described several alternative methods of making the photovoltaic device 1. In all of the methods, the individual layers 11 to 16 of the photovoltaic device 1 may in themselves be manufactured using conventional processes suitable for the material and construction of the photoactive layer 14, except that the process of forming the photoactive layer 14 is modified to provide the first part 40 and second part 41 in pre-selected locations, or a pre-selected distribution of locations.

The methods are illustrated in the flow charts of FIGS. 8, 10, 12, 14, 16, 18, 20, 22, 24, 26, 28, 30, 32, 34, 36 and 38, also making reference to the schematic cross-sectional views of FIGS. 9, 11, 13, 15, 17, 19, 21, 23, 25, 27, 29, 31, 33, 35, 37 and 39 that show the photovoltaic device 1 at given steps of the method. The methods may be applied across the area of an entire photovoltaic device 1 that is subsequently divided into cells 30, or may be applied to make individual cells 30 separately in different locations across the base layer 11.

All of the methods start with a first stage illustrated in FIG. 8, as follows. In step S8-1, the base layer 11 is provided. In step S8-2, the bottom conductive layer 12 is deposited on the base layer 12. In step S8-3, the bottom semiconductor layer 13 is deposited on the bottom conductive layer 13 (FIG. 9).

There will now be described some further stages of the method in alternatives in which the photoactive material 23 is formed from a precursor material that is a precursor to the photoactive material and is converted into the photoactive material by a conversion fluid. This may be referred to as a two-part process. The precursor material may be any one or more substances that is capable of conversion into a photoactive material under suitable conditions. The conversion fluid may be any one or more substances that is capable of converting the precursor material. Various material systems are known and may be applied here.

In the two-part process, the method effectively comprises either forming the precursor material selectively across the locations of the first part 40 but not the second part 41, so that on application of the conversion fluid the photoactive material is formed selectively in the location of the first part 40 but not the second part 41, or forming the precursor material across the entire region followed by selective application of the conversion fluid across the locations of the first part 40 but not the second part 41, so that the photoactive material is formed selectively in those locations.

The two-part process has the advantage that it is more straightforward to ensure consistent formation of the photoactive material throughout the device, as the process of forming the photoactive material occurs selectively in the location of the first part 40, as opposed to across the entire area of a cell. This is particularly true when the photoactive material has a crystalline structure (i.e. poly or monocrystalline) as the ordered structure of the photoactive material can be maintained more consistently when formed across the relatively small area of the first part 40.

As described above, the photoactive material 23 may comprise a photoactive perovskite wherein a perovskite is a material with a three-dimensional crystal structure represented by formula (I):

$$[A][B][X]_3 \qquad (I)$$

wherein [A] is at least one cation, [B] is at least one cation, and [X] is at least one anion.

When the photoactive material 23 does comprise a photoactive perovskite, the precursor material comprises one or more precursor compounds, with each of the one or more precursor compounds comprising one of the at least one cations [B] and one of the at least one anions [X]. The precursor material may then comprise one or more precursor compounds each of formula $[B][X]_2$.

The conversion fluid may then comprise a solution comprising the at least one cation [A] and one or more of the at least one anions [X]. The method of making the photovoltaic device 1 may then further comprise a step of forming the conversion fluid by dissolving one or more further precursor compounds in a suitable solvent system, wherein each of the one or more further precursor compounds comprising one of the at least one cations [A] and one of the at least one anions [X]. The conversion fluid may then comprise one or more further precursor compound each of formula [A][X] dissolved in a suitable solvent system. For example, when the photoactive material 23 is an organometal halide perovskite, the precursor material may comprise a metal halide, where [B] will then comprise a metal cation and [X] a halide anion (e.g. a lead halide or a tin halide, or a mixture of both). The conversion fluid may then comprise an organic halide solution, where [A] will then comprise an organic cation and [X] a halide anion (e.g. a methylammonium halide solution, a formamidium halide solution or a mixture of both).

When the photoactive material 23 comprises a photoactive organometal halide perovskite it is preferable that each of the one or more precursor compounds are metal halides (e.g. are of formula $[B][X]_2$), as such compounds are more compatible with selective deposition processes than organic halide compounds (e.g. of formula [A][X]). For example, when the precursor material is to be selectively deposited using printing methods, organic halide compounds require more robust printing heads than metal halide compounds.

Figure 8:
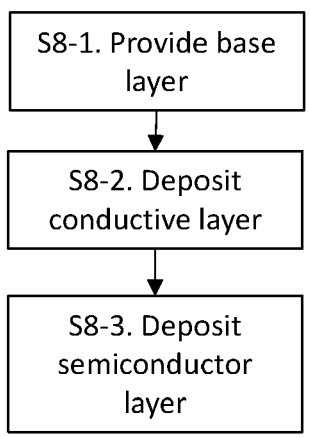
FIG. 8 is a flow chart of a first stage of a method of making the photovoltaic device.
Figure 9:
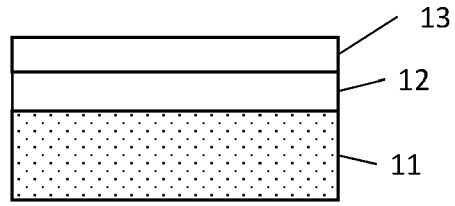
FIG. 9 is a schematic cross-sectional view of the photovoltaic device partially made by method of FIG. 8.

FIGS. 10, 12, 14 and 16 show the second stage following the first stage of FIG. 8 of some alternative methods in which the precursor material is formed selectively across the locations of the first part 40 but not the second part 41, so that on application of the conversion fluid the photoactive material is formed selectively in the location of the first part 40 but not the second part 41.

Figure 10:
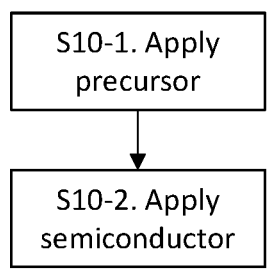
Figure 11:
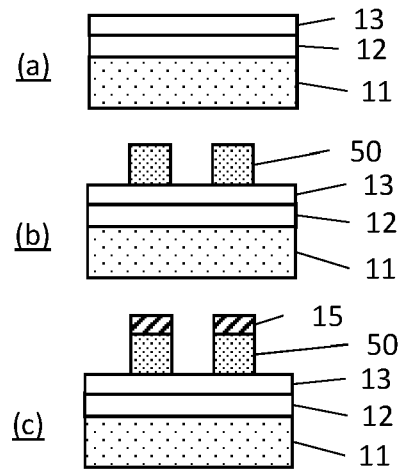

FIG. 10 shows a second stage as follows, starting with the layers 11 to 13 from the first stage of FIG. 8 (FIG. 11(a)).

In step S10-1, precursor material 50 is deposited on the bottom semiconductor layer 13, selectively across the locations of the first part 40 but not the second part 41 by being applied selectively to the locations of the first part 40, i.e. not applied to the locations of the second part 41 (FIG. 11(b)). The selective application may be performed by printing, patterning or spraying the precursor material.

In step S10-2, which is optional, semiconductor material is applied selectively to the precursor material 50 in the locations of the first part 40, to form the top semiconductor layer 15 (FIG. 11(c)).

Figure 12:
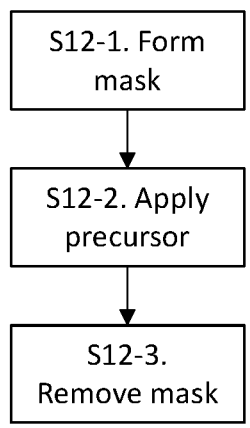
Figure 13:
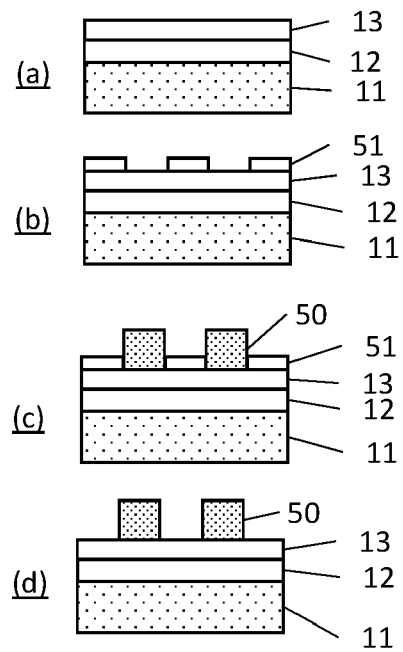

FIG. 12 shows an alternative second stage as follows, starting with the layers 11 to 13 from the first stage of FIG. 8 (FIG. 13(a)), and in which precursor material 50 is deposited on the bottom semiconductor layer 13, selectively across the locations of the first part 40 using a patterned mask 51 arranged to inhibit deposition of the precursor material 50 across the locations of the second part 41.

In step S12-1, the patterned mask 51 is formed on the bottom semiconductor layer 13 across the locations of the second part 41 but not the first part 40 (FIG. 13(b)). The patterned mask 51 may be formed by printing or spraying.

In step S12-2, the precursor material 50 is applied across the entire region, but inhibition of deposition by the patterned mask 51 in the locations of the second part 41 causes the precursor material 50 to be deposited selectively across the locations of the first part 40 (FIG. 13(c)).

In step S12-3, which is optional, the patterned mask 50 is removed (FIG. 13(d)). When step S12-3 is not performed, the patterned mask 50 is retained within the structure of the photovoltaic device 1 to form at least part of the second part 41. In that case, the patterned mask 50 is optically transmissive material having a greater transmittance of visible light than the first part 41.

FIG. 14 shows an alternative second stage as follows, starting with the layers 11 to 13 from the first stage of FIG. 8 (FIG. 15(a)), being a process in which precursor material 50 is formed selectively across the locations of the first part 40 by being applied across the entire region, but then selectively removed from the locations of the second part 41.

In step S14-1, the precursor material 50 is deposited across the entire region (FIG. 15(b)).

In step S14-2, precursor material 50 is removed selectively from the locations of the second part 41, so that it remains across the locations of the first part 40 (FIG. 15(c)). This may be done by a selective removal process such as laser etching.

FIG. 16 shows an alternative second stage as follows, starting with the layers 11 to 13 from the first stage of FIG. 8 (FIG. 17(a)), being another process in which precursor material 50 is formed selectively across the locations of the first part 40 by being applied across the entire region, but then selectively removed from the locations of the second part 41.

In step S16-1, the precursor material 50 is deposited across the entire region (FIG. 17(b)).

In step S16-2, a patterned mask 52 arranged to inhibit chemical etching is formed to the precursor material 50 across the locations of the first part 40 (FIG. 17(c)). The patterned mask 52 may be formed by printing or spraying the patterned mask 52.

In step S16-3, the precursor material 50 is chemically etched. Inhibition of etching by the patterned mask 52 causes the precursor material to be removed selectively from the locations of the second part 41, so that it remains across the locations of the first part 40.

The patterned mask 52 may be semiconductor material that forms the top semiconductor layer 15. In that case, the semiconductor material is retained on the precursor material 50 (FIG. 17(d)).

Alternatively, in step S16-4, which is optional, the patterned mask 52 is removed after the chemical etching (FIG. 17(e)).

FIG. 18 shows a third stage that follows the second stage of any of FIGS. 10, 12, 14 and 16 unless semiconductor material that forms the top semiconductor layer 15 is formed on the precursor material 50, e.g. because the optional step S10-2 of applying the semiconductor material has been performed or step S16-4 is not performed so the patterned mask 52 is retained, or unless the patterned mask 51 is retained because step S12-3 is not performed. Thus, the third stage of FIG. 18 starts with the layers 11 to 13 and the precursor material 50 (FIG. 19(a)).

In step S18-1, the conversion fluid 53 is applied to the precursor material (FIG. 19(b)). The conversion fluid 53 converts the precursor material 50 located in the locations of the first part 40 into photoactive material 23.

In step S18-2, the conversion fluid 53 is removed, leaving the photoactive material 23 forming the first part 40 (FIG. 19(c)).

In step S18-3, a filler material 54 is applied in the locations of the second part 41, thereby forming the second part 41 (FIG. 19(d)). The filler material 54 is optically transmissive material selected to have a greater transmittance of visible light than the first part 41. The filler material 54 may be shallower than the photoactive material 23.

In step S18-4, semiconductor material is applied extending across entire region 33, that is across the locations of both the first part 40 and the second part 41, to form the top semiconductor layer 15 (FIG. 19(*e*)). In the case that the filler material 54 is shallower than the photoactive material 23, then the semiconductor material extends lower than the photoactive material 23 in the locations of the second part 41.

In step S18-5, the top conductive layer 16 is deposited (FIG. 19(*f*)).

FIG. 20 shows a third stage that follows the second stage of any of FIGS. 10, 12, 14 and 16 in the case that semiconductor material that forms the top semiconductor layer 15 is already formed on the precursor material 50, e.g. because the optional step S10-2 of applying the semiconductor material has been performed, or in the case of the second stage of FIG. 16 the patterned mask 52 forms the top semiconductor layer 15. Thus, the third stage of FIG. 20 starts with the layers 11 to 13, the precursor material 50 and semiconductor material that forms the top semiconductor layer 15 (FIG. 21(*a*)).

In step S20-1, the conversion fluid 53 is applied to the precursor material (FIG. 21(*b*)). The conversion fluid 53 converts the precursor material 50 located in the locations of the first part 40 into photoactive material 23.

In step S20-2, the conversion fluid 53 is removed, leaving the photoactive material forming the first part 40 (FIG. 21(*c*)).

In step S20-3, a filler material 54 is applied in the locations of the second part 41, thereby forming the second part 41 (FIG. 21(*d*)). The filler material 54 is selected to have a greater transmittance of visible light than the first part 41.

The filler material 54 may be sufficiently insulating to limit the flow of current thereacross, compared to the flow of current through the photoactive material. This is particularly advantageous in the case that the first part 40 is located in plural separate areas within the second part 41, because it limits the flow of current within the areas of the second part 41.

The filler material 54 may be coloured, for example by comprising a dye. This may provide the photovoltaic device 1 with any desired colour as perceived by an observer.

Suitable filler materials may be any inorganic or organic material or surface modification that is more transparent to visible light than the photoactive first part. Preferably, the filler material is sufficiently insulating or of sufficient thickness to hinder recombination of electrons and holes at the interface with the top semiconductor layer or the bottom semiconductor layer.

In step S20-4, the top conductive layer 16 is deposited (FIG. 21(*e*)).

Figure 22:
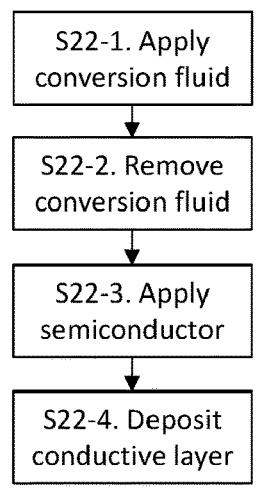

FIG. 22 shows a third stage that follows the second stage of FIG. 12 in the case that the patterned mask 51 is retained because step S12-3 is not performed. Thus, the third stage of FIG. 18 starts with the layers 11 to 13, the precursor material 50 and the patterned mask 51 (FIG. 23(*a*)).

Figure 23:
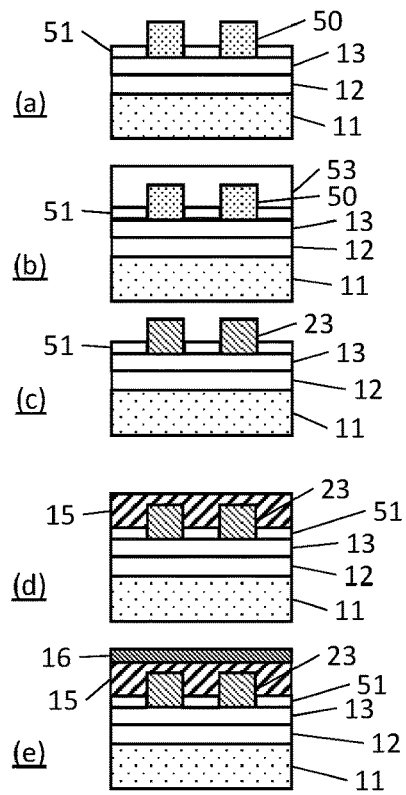

In step S22-1, the conversion fluid 53 is applied to the precursor material (FIG. 23(*b*)). The conversion fluid 53 converts the precursor material 50 located in the locations of the first part 40 into photoactive material 23.

In step S22-2, the conversion fluid 53 is removed, leaving the photoactive material 23 forming the first part 40 (FIG. 23(*c*)).

In step S22-3, semiconductor material is applied extending across entire region 33, that is across the locations of both the first part 40 and the second part, to form the top semiconductor layer 15 (FIG. 23(*d*)). As the patterned mask 51 is shallower than the photoactive material 23, then the semiconductor material extends lower than the photoactive material 23 in the locations of the second part 41.

In step S22-4, the top conductive layer 16 is deposited (FIG. 23(*e*)).

Figure 24:
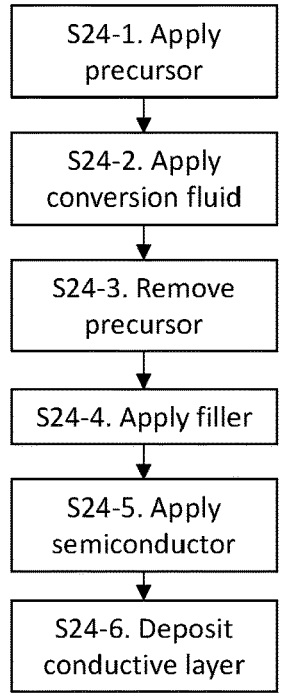
FIGS. 24 and 26 are flow charts of alternative second stages of a method of making the photovoltaic device.
Figure 25:
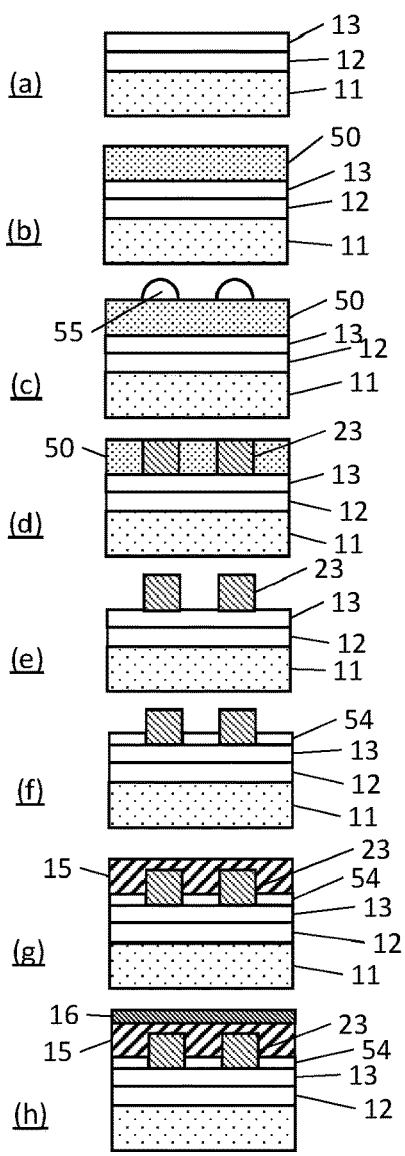
FIGS. 25 and 27 are schematic cross-sectional views of the photovoltaic device during the respective methods of FIGS. 24 and 26.

FIGS. 24 and 25 show the second stage following the first stage of FIG. 8 of some alternative methods in which the precursor material is formed across the entire region, but the conversion fluid is applied selectively across the locations of the first part 40 but not the second part 41, so that the photoactive material is formed selectively in those locations.

FIG. 24 shows a second stage as follows, starting with the layers 11 to 13 from the first stage of FIG. 8 (FIG. 25(*a*)).

In step S24-1, the precursor material 50 is deposited across the entire region (FIG. 25(*b*)).

In step S24-2, the conversion fluid 55 is applied selectively to the precursor material 50 in the locations of the first part 40 but not the second part 41 (FIG. 25(*c*)), by being applied directly onto the precursor material 50 selectively across the locations of the first part 40 but not across the locations of the second part 41. The conversion fluid 55 may be applied selectively by printing, patterning or spraying the conversion fluid 55. The conversion fluid 55 converts the precursor material 50 located in the locations of the first part 40 into photoactive material 23 that forms the first part 40, leaving precursor material that is unconverted in the locations of the second part 41 (FIG. 25(*d*)). As part of this step, any unconsumed conversion fluid may be removed after the conversion reaction has finished.

In step 24-3, the precursor material 50 is removed from the locations of the second part 41 (FIG. 25(*e*)).

In step S24-4, a filler material 54 is applied in the locations of the second part 41, thereby forming the second part 41 (FIG. 25(*f*)). The filler material 54 is optically transmissive material selected to have a greater transmittance of visible light than the first part 41. The filler material 54 may be shallower than the precursor material 50.

In step S24-5, semiconductor material is applied extending across entire region 33, that is across the locations of the first part 40 and the second part 41, to form the top semiconductor layer 15 (FIG. 25(*g*)). In the case that the filler material 54 is shallower than the photoactive material 23, then the semiconductor material extends lower than the photoactive material 23 in the locations of the second part 41.

In step S24-6, the top conductive layer 16 is deposited (FIG. 25(*h*)).

Figure 26:
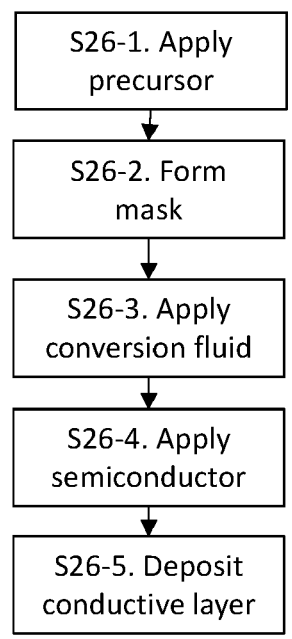

FIG. 26 shows an alternative second stage as follows, starting with the layers 11 to 13 from the first stage of FIG. 8 (FIG. 27(*a*)), in which the conversion fluid 55 is applied selectively to the precursor material 50 in the locations of the first part 40 but not the second part 41 using a patterned mask 56 that forms a barrier to the conversion fluid 55.

Figure 27:
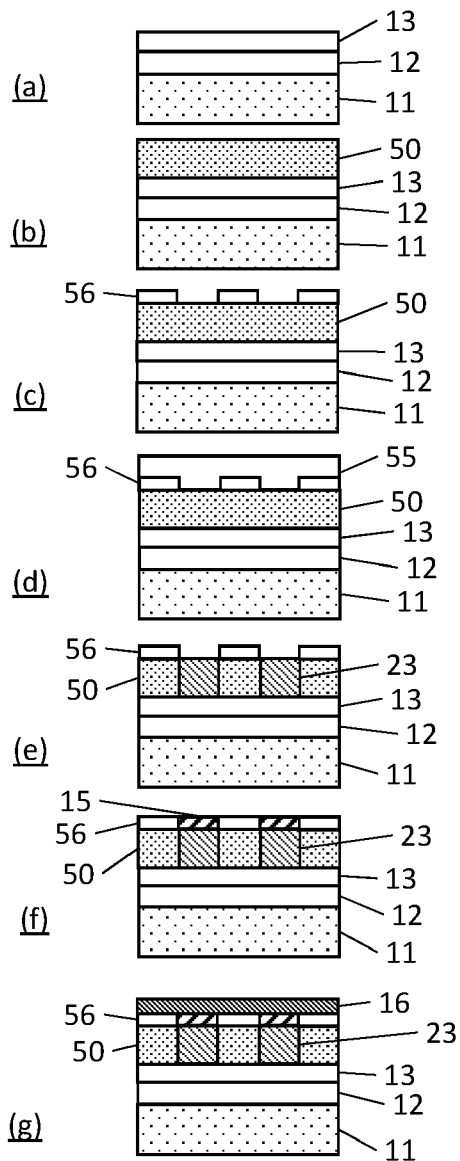

In step S26-1, the precursor material 50 is deposited across the entire region (FIG. 27(*b*)).

In step S26-2, the patterned mask 56 is formed on the precursor material 50 across the locations of the second part 41 but not the first part 40 (FIG. 27(*c*)). The patterned mask 56 may be formed by printing, patterning or spraying.

In step S26-3, the conversion fluid 55 is applied across the entire region (FIG. 27(*d*)). As the patterned mask 56 acts as a barrier in the location of the second part 41, the conversion fluid is applied selectively to the precursor material 50 in the locations of the first part 40 but not the locations of the second part 41. The conversion fluid 55 converts the precursor material 50 located in the locations of the first part 40 into photoactive material 23 that forms the first part 40, leaving precursor material that is unconverted in the locations of the second part 41 (FIG. 27(e)). As part of this step, any unconsumed conversion fluid may be removed after the conversion reaction has finished.

The patterned mask 56 may be retained on the precursor material 50 in which case the patterned mask 56 is optically transmissive material having a greater transmittance of visible light than the first part 41. In an alternative that is not shown, the patterned mask 56 may be removed, and an optically transmissive material may be applied across the precursor material 50 forming the second part 41.

In step S26-4, semiconductor material is applied selectively to the precursor material 50 in the locations of the first part 40, to form the top semiconductor layer 15 (FIG. 27(f)).

In step S26-5, the top conductive layer 16 is deposited (FIG. 27(g)).

There will now be described some further stages of the method in alternatives in which the photoactive material 23 is formed directly on the photovoltaic device 1 without use of an intermediate, precursor material. This may be referred to as a one-part process. photoactive material 23 may be any one or more substances that is capable of being formed in such a process under suitable conditions.

Possible one-part material systems include a solution of a methylammonium halide or a formamidinium halide, or a combination of both, and a lead halide or a tin halide or a combination of both, dissolved in a suitable solvent or combination of solvents such as DMSO (dimethyl sulfoxide), GBL (γ-butyrolactone), or DMF (dimethylformamide). One particular example is methylammonium iodide and lead chloride dissolved in DMSO.

FIGS. 28, 30, 32 and 34 show the second stage following the first stage of FIG. 8 of some alternative methods in which the photoactive material 23 is formed selectively across the locations of the first part 40 but not the second part 41, so that on application of the conversion fluid the photoactive material is formed selectively in the location of the first part 40 but not the second part 41.

Figure 28:
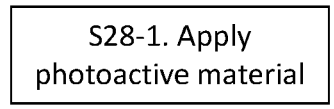
FIGS. 28, 30, 32 and 34 are flow charts of alternative second stages of a method of making the photovoltaic device.
Figure 29:
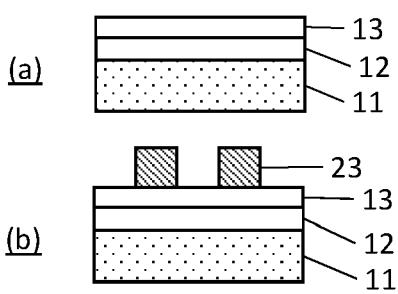
FIGS. 29, 31, 33 and 35 are schematic cross-sectional views of the photovoltaic device during the respective methods of FIGS. 28, 30, 32 and 34.

FIG. 28 shows a second stage as follows, starting with the layers 11 to 13 from the first stage of FIG. 8 (FIG. 29(a)).

In step S28-1, the photoactive material 23 is deposited on the bottom semiconductor layer 13, selectively across the locations of the first part 40 but not the second part 41 by being applied selectively to the locations of the first part 40, i.e. not applied to the locations of the second part 41 (FIG. 29(b)). The selective application may be performed by printing, patterning or spraying the one-part material system.

Figure 30:
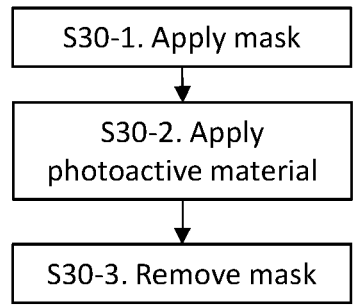
Figure 31:
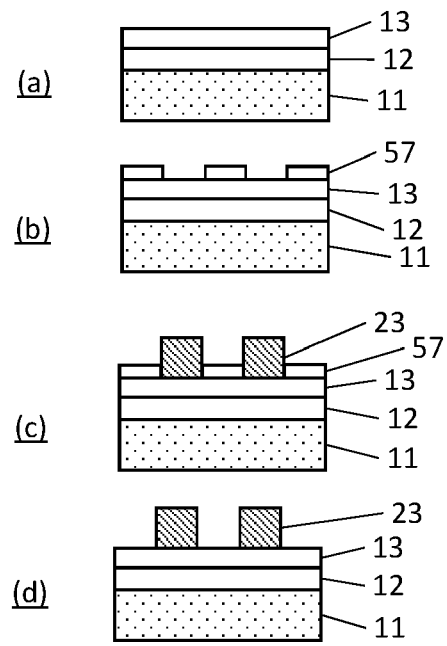

FIG. 30 shows an alternative second stage as follows, starting with the layers 11 to 13 from the first stage of FIG. 8 (FIG. 31(a)), and in which the photoactive material 23 is deposited on the bottom semiconductor layer 13, selectively across the locations of the first part 40 using a patterned mask 57 arranged to inhibit deposition of the photoactive material 23 across the locations of the second part 41.

In step S30-1, the patterned mask 57 is formed on the bottom semiconductor layer 13 across the locations of the second part 41 but not the first part 40 (FIG. 31(b)). The patterned mask 51 may be formed by printing, patterning or spraying.

In step S30-2, the photoactive material 23 is applied across the entire region, but inhibition of deposition by the patterned mask 57 in the locations of the second part 41 causes the photoactive material 23 to be deposited selectively across the locations of the first part 40 (FIG. 31(c)).

In step S30-3, which is optional, the patterned mask 57 is removed (FIG. 31(d)). When step S30-3 is not performed, the patterned mask 57 is retained within the structure of the photovoltaic device 1 to form the second part 41. In that case, the patterned mask 57 is optically transmissive material having a greater transmittance of visible light than the first part 41.

Figure 32:
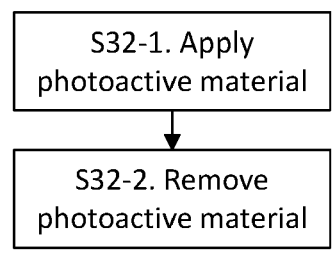
Figure 33:
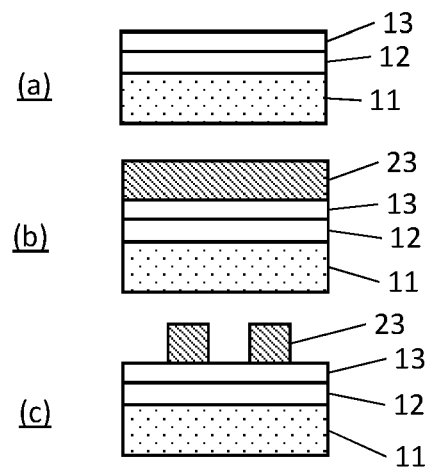

FIG. 32 shows an alternative second stage as follows, starting with the layers 11 to 13 from the first stage of FIG. 8 (FIG. 33(a)), being a process in which the photoactive material 23 is formed selectively across the locations of the first part 40 by being applied across the entire region, but then selectively removed from the locations of the second part 41.

In step S32-1, the photoactive material 23 is deposited across the entire region (FIG. 33(b)).

In step S32-2, the photoactive material 23 is removed selectively from the locations of the second part 41, so that it remains across the locations of the first part 40 (FIG. 33(c)). This may be done by a selective removal process such as laser etching.

Figure 34:
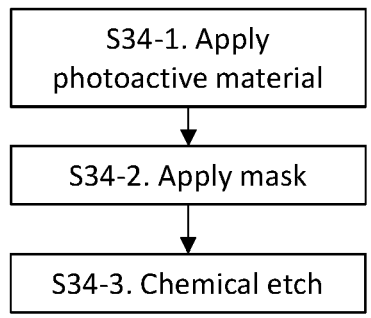
Figure 35:
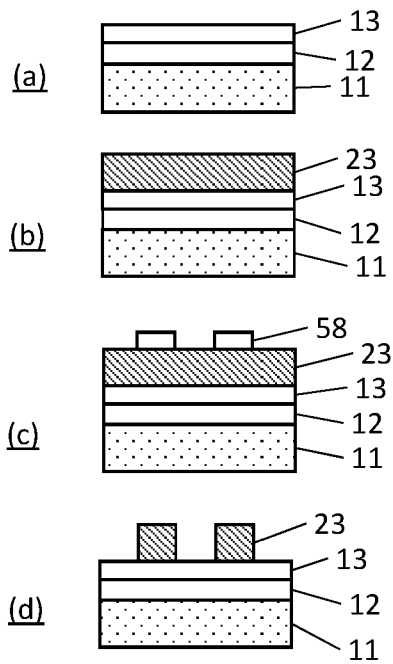

FIG. 34 shows an alternative second stage as follows, starting with the layers 11 to 13 from the first stage of FIG. 8 (FIG. 35(a)), being another process in which the photoactive material 23 is formed selectively across the locations of the first part 40 by being applied across the entire region, but then selectively removed from the locations of the second part 41.

In step S34-1, the photoactive material 23 is deposited across the entire region (FIG. 35(b)).

In step S34-2, a patterned mask 58 arranged to inhibit chemical etching is formed to the photoactive material 23 across the locations of the first part 40 (FIG. 35(c)). The patterned mask 58 may be formed by printing, patterning or spraying the patterned mask 52.

In step S34-3, the photoactive material 23 is chemically etched. Inhibition of etching by the patterned mask 58 causes the photoactive material 23 to be removed selectively from the locations of the second part 41, so that it remains across the locations of the first part 40.

The patterned mask 58 may be semiconductor material that forms the top semiconductor layer 15. In that case, the semiconductor material is retained on the photoactive material 23 (not shown) and the step of depositing it described below can be omitted.

Alternatively, the patterned mask 58 is removed after the chemical etching (FIG. 35(d)).

Figure 36:
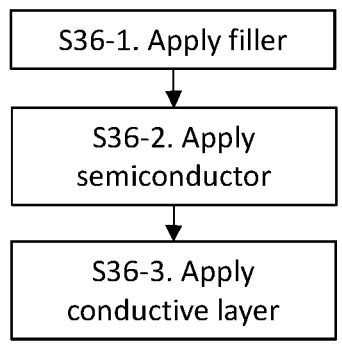
FIGS. 36 and 38 are flow charts of alternative third stages of a method of making the photovoltaic device.
Figure 37:
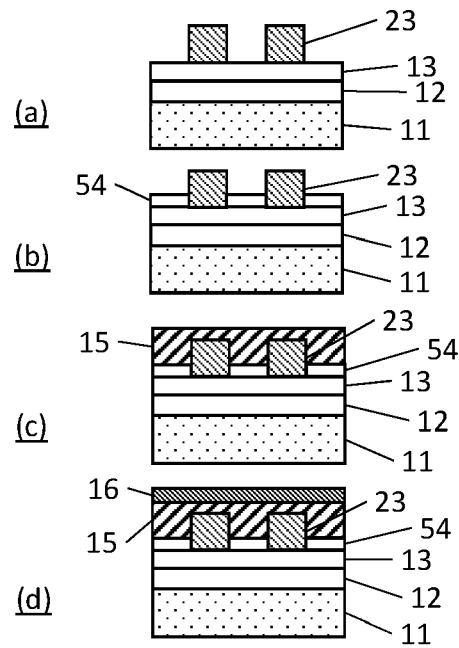
FIGS. 37 and 39 are schematic cross-sectional views of the photovoltaic device during the respective methods of FIGS. 36 and 38.

FIG. 36 shows a third stage that follows the second stage of any of FIGS. 28, 30, 30 and 34, except in the case of the second stage of FIG. 30 if the patterned mask 57 is retained because step S30-3 is not performed. The third stage of FIG. 36 starts with the layers 11 to 13 and the photoactive material 23 (FIG. 37(a)).

In step S36-1, a filler material 54 is applied in the locations of the second part 41, thereby forming the second part 41 (FIG. 37(b)). The filler material 54 is optically transmissive material selected to have a greater transmittance of visible light than the first part 41. The filler material 54 may be shallower than the precursor material 50.

In step S36-2, semiconductor material is applied extending across entire region 33, that is across the locations of the first part 40 and the second part 41, to form the top semiconductor layer 15 (FIG. 37(c)). In the case that the filler material 54 is shallower than the precursor material 50, then the semiconductor material extends lower than the precursor material 50 in the locations of the second part. In step S36-3, the top conductive layer 16 is deposited (FIG. 37(d)).

Figure 38:
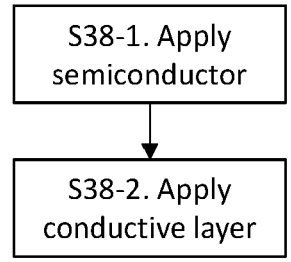
Figure 39:
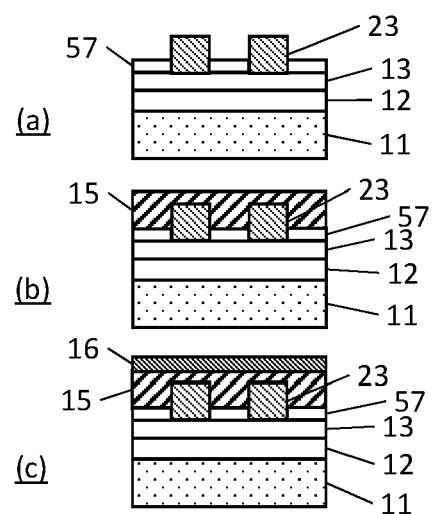

FIG. 38 shows a third stage that follows the second stage of FIG. 30 if the patterned mask 57 is retained because step S30-3 is not performed. Thus, the third stage of FIG. 38 starts with the layers 11 to 13, the photoactive material 23 and the patterned mask 57 (FIG. 39(a)).

In step S38-1, semiconductor material is applied extending across entire region 33, that is across the locations of both the first part 40 and the second part, to form the top semiconductor layer 15 (FIG. 39(b)). As the patterned mask 57 is shallower than the photoactive material 23, then the semiconductor material extends lower than the photoactive material 23 in the locations of the second part 41.

In step S38-2, the top conductive layer 16 is deposited (FIG. 39(c)).

Some comments that apply generally to several of the methods described above are as follows.

In any method where a filler material 54 is applied, that step is optional.

In some of the methods above, the semiconductor material forming the top semiconductor layer 15 is applied selectively in the locations of the first part 40 where light is absorbed by the photoactive material 23 for example in the methods of FIG. 10 when optional step S10-2 is performed, FIG. 17 when the patterned mask 51 is semiconductor material that is retained, FIG. 26, and FIG. 34 when the patterned mask 58 is semiconductor material that is retained. In this case, the semiconductor material does not need to be fully optically transmissive.

In some of the methods above, the semiconductor material forming the top semiconductor layer 15 extends across the second part 41 as well as the first part 40, for example in the methods of FIG. 24, 36 or 38. In these cases, the semiconductor material is an optically transmissive material selected to have a greater transmittance of visible light than the first part 41.

In various methods described above optically transmissive material is applied to form the second part 41 in the resultant photovoltaic device 1, for example the patterned mask 51, the filler material 54, the patterned mask 56 or the patterned mask 57. The following comments apply to the optically transmissive material in every case.

The optically transmissive material has a greater transmittance of visible light than the first part 40. This is to ensure that the second part 41 has a higher optical transmittance than the first part 40.

The optically transmissive material may be electrically insulating. Advantageously, the optically transmissive material is sufficiently insulating to prevent recombination of electrons and holes between the bottom semiconductor layer 13 and the top semiconductor layer 15.

The optically transmissive material may be coloured, for example by comprising a dye. This may provide the photovoltaic device 1 with any desired colour as perceived by an observer.

The methods described above may be applied to an photovoltaic device 1 in which the photoactive layer 14 has a single region for which the entire bottom conductive layer 12 and top conductive layer 16 on opposite sides thereof form conductive electrodes, and so the pattern of the first part 40 and second part 41 extend across the entire region of the photoactive layer 14. If that is the desired form of the photovoltaic device 1, then the method ends at this point. If it is desired to form a photovoltaic device 1 having plural cells 30, then the methods may be applied to make individual cells 30 separately in different locations across the base layer 11. Alternatively, the methods described above may be applied across the area of an entire photovoltaic device 1 and supplemented by an additional stage of separating the layers 11 to 16 into the plural cells 30 and forming the electrical connectors 36. This stage may be performed by any suitable technique, for example as disclosed in disclosed in WO-2011/048352. The first part 40 and second part 41 are provided with their desired pattern of locations in each cell 30, for example by forming a pattern across the entire photovoltaic device 1 that is divided up by the separation into cells 30.

It will be appreciated that individual items described above may be used on their own or in combination with other items shown in the drawings or described in the description and that items mentioned in the same passage as each other or the same drawing as each other need not be used in combination with each other.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that whilst the above-described embodiments of the invention all relate to photovoltaic devices, aspects of the invention may be equally applicable to other optoelectronic devices. In this regard, the term "optoelectronic devices" includes photovoltaic devices, photodiodes (including solar cells), phototransistors, photomultipliers, photoresistors, and light emitting diodes etc. In particular, whilst in the above-described embodiments the photoactive material is used as a light absorber/photosensitizer, it may also function as light emitting material by accepting charge, both electrons and holes, which subsequently recombine and emit light.

The invention claimed is:

1. A method of making a photovoltaic device comprising forming a plurality of cells, each of the plurality of cells comprising a photoactive layer and first and second conductive electrodes on opposite sides thereof, the photoactive layer of each cell being formed by a process that causes the photoactive layer in each respective cell to comprise a first part that comprises light absorbing photoactive material and a second part that is not photoactive and that has a greater transmittance of visible light than the light absorbing photoactive material, which first and second parts are in pre-selected locations, or in a pre-selected distribution of locations, across the photoactive layer with one of the first and second parts being located in plural separate areas within the other of the first and seconds parts,
    wherein the photoactive layers of the plurality of cells are spaced apart and electrically isolated from each other,
    the first electrodes of the plurality of cells are spaced apart and electrically isolated from each other,
    the second electrodes of the plurality of cells are spaced apart and electrically isolated from each other,
    wherein the process of forming the plurality of cells comprises:
    a step of forming a precursor material, that is a precursor to the photoactive material: and
    a step of applying a conversion fluid to the precursor material, the conversion fluid converting the precursor material into the photoactive material to form the first part, and
    wherein the step of forming the precursor material comprises depositing the precursor material entirely across the photoactive layer, and a step of removing the precursor material selectively from the locations of the second part, whereby the precursor material remains across the locations of the first part.

2. The method according to claim 1, wherein said step of removing the precursor material selectively from the locations of the second part comprises:
applying a patterned mask arranged to inhibit chemical etching across the locations of the first part; and
chemically etching the precursor material, whereby inhibition of etching by the patterned mask causes the precursor material to be removed from the locations of the second part.

3. The method according to claim 2, wherein a top semiconductor layer comprising semiconductor material is formed across the photoactive layer of each of the plurality of cells, the patterned mask being the semiconductor material and being applied selectively across the locations of the first part.

4. The method according to claim 1, wherein the conversion fluid is applied selectively to the precursor material in the locations of the first part but not the second part.

5. The method according to claim 4, wherein said step of applying the conversion fluid selectively to the precursor material in the locations of the first part but not the second part comprises any of:
(a) applying the conversion fluid selectively across the locations of the first part but not the second part; or
(b) forming a patterned mask arranged to form a barrier to the conversion fluid across the locations of the second part; and applying the conversion fluid entirely across the photoactive layer, whereby the patterned mask causes the conversion fluid to be applied selectively to the precursor material in the locations of the first part but not the second part.

6. The method according to claim 5, wherein the patterned mask is optically transmissive material having a greater transmittance of visible light than the first part, that is retained to form the second part.

7. The method according to claim 4, wherein the method further comprises applying an optically transmissive material across the precursor material in the second part.

8. The method according to claim 1, wherein the process of forming the photoactive layer further comprises applying an optically transmissive material to form the second part, the optically transmissive material having a greater transmittance of visible light than the first part.

9. The method according to claim 1, wherein the first and second parts are in pre-selected locations across the photoactive layer with the locations of one of the first and second parts being plural separate areas of pre-selected position, shape and size.

10. The method according to claim 1, wherein the first and second parts are in a pre-selected distribution of locations across the photoactive layer with the locations of said one of the first and second parts being plural separate areas in a pre-selected distribution of position, shape and size.

11. The method according to claim 1, wherein the photoactive material is a photoactive perovskite.

12. A method according to claim 11, wherein the perovskite is a perovskite compound of formula (I):

$$[A][B][X]_3 \qquad (I)$$

wherein [A] is at least one cation, [B] is at least one cation, and [X] is at least one anion.

13. The method according to claim 1, wherein the photoactive material is a photoactive perovskite compound of formula (I):

$$[A][B][X]_3 \qquad (I)$$

wherein [A] is at least one cation, [B] is at least one cation, and [X] is at least one anion, and wherein the precursor material comprises one or more precursor compounds, each of the one or more precursor compounds comprising one of the at least one cations [B] and one of the at least one anions [X].

14. The method according to claim 13, wherein the conversion fluid comprises a solution comprising the at least one cation [A] and one or more of the at least one anions [X].

15. The method according to claim 14, and further comprising forming the conversion fluid by dissolving one or more further precursor compounds in a suitable solvent system, each of the one or more further precursor compounds comprising one of the at least one cations [A] and one of the at least one anions [X].

16. The method according to claim 1, further comprising electrical connectors, each electrical connector connecting between the second electrode of a respective cell and the first electrode of an adjacent cell, the electrical connectors providing connection of the photoactive regions of the cells in series across the photovoltaic device.

* * * * *